(12) United States Patent
Chang et al.

(10) Patent No.: US 8,687,398 B2
(45) Date of Patent: Apr. 1, 2014

(54) SENSE SCHEME FOR PHASE CHANGE MATERIAL CONTENT ADDRESSABLE MEMORY

(75) Inventors: Leland Chang, New York, NY (US); Chung H. Lam, Peekskill, NY (US); Jing Li, Ossining, NY (US); Robert K. Montoye, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 13/407,813

(22) Filed: Feb. 29, 2012

(65) Prior Publication Data

US 2013/0223121 A1    Aug. 29, 2013

(51) Int. Cl.
*G11C 15/00* (2006.01)
(52) U.S. Cl.
USPC ............... 365/49.15; 365/49.16; 365/49.17
(58) Field of Classification Search
USPC ................................. 365/49.15, 49.16, 49.17
See application file for complete search history.

(56) References Cited

U.S. PATENT DOCUMENTS

| | | | |
|---|---|---|---|
| 6,373,738 B1 * | 4/2002 | Towler et al. | 365/49.1 |
| 6,597,598 B1 | 7/2003 | Tran et al. | 365/94 |
| 6,856,528 B1 * | 2/2005 | Kim | 365/49.1 |
| 6,999,331 B2 * | 2/2006 | Huang | 365/49.17 |
| 7,126,834 B1 * | 10/2006 | Meng et al. | 365/49.11 |
| 7,358,768 B2 * | 4/2008 | Hua et al. | 326/54 |
| 7,660,152 B2 | 2/2010 | Lamorey et al. | 365/163 |
| 7,692,958 B2 | 4/2010 | Parkinson | 365/163 |
| 7,724,564 B2 | 5/2010 | Taylor et al. | 365/148 |
| 7,751,218 B2 * | 7/2010 | Arsovski | 365/49.17 |
| 7,796,454 B2 | 9/2010 | Lin et al. | 365/207 |
| 7,835,173 B2 | 11/2010 | Ma et al. | 365/148 |
| 7,859,888 B2 | 12/2010 | Liu et al. | 365/148 |

OTHER PUBLICATIONS

Igor Arsovski and Reid Wistort, "Self-referenced sense amplifier for across-chip-variation immune sensing in high-performance Content-Addressable Memories" IBM Silicon Solutions, publication date unknown.

* cited by examiner

*Primary Examiner* — Pho M Luu
(74) *Attorney, Agent, or Firm* — Ido Tuchman; Vazken Alexanian

(57) ABSTRACT

A sensing circuit and method for sensing match lines in content addressable memory. The sensing circuit includes an inverter electrically coupled in a feedback loop to a match line. The inverter includes an inverting threshold of the match line. The match line is charged to substantially a first voltage threshold during a pre-charge phase. An evaluation phase occurs when the match line voltage drops from substantially the first voltage threshold to substantially the second voltage threshold.

19 Claims, 6 Drawing Sheets

SENSE SCHEME FOR PHASE CHANGE MATERIAL CONTENT ADDRESSABLE MEMORY

BACKGROUND

The present invention relates to computer readable memory, and more particularly a sensing scheme for content addressable memory.

Content addressable memory (CAM) provides a hardware solution to the rapid search operations utilized in information networks, such as the internet. Unlike random access memory (RAM), which retrieves data from different locations in memory by a supplied address, CAMs search the entire memory for a supplied data word and return the address and possibly associated data. This design offers a faster method for matching functions, such as those performed by routers and network servers.

In order to rapidly compare a supplied data word with all stored data words in parallel, each CAM cell contains additional bit-comparison circuitry, aside from the storage element hardware. The additional hardware is coupled across each stored word with a match line. This arrangement allows all bits within a stored word to be compared in one clock cycle.

However, as advancements in memory technology allow for scaling of smaller devices, the margin between match and mismatch voltage signals becomes smaller. Such noise and random device variation increasingly provide timing and data retrieval uncertainty. Since CAM search hardware compares multiple bits in one line, the sensitivity to noise and variation is further increased.

BRIEF SUMMARY

One aspect of the invention is a sensing circuit for a CAM. The sensing circuit includes a match line. The sensing circuit also includes an inverter electrically coupled in a feedback loop to the match line. The inverter includes an inverting threshold of the match line. The inverting threshold is equal to a first voltage threshold during a pre-charge phase. During an evaluation phase, the inverting threshold is equal to a second voltage threshold.

Another aspect of the invention is a Content Addressable Memory (CAM). The CAM includes a match line and an inverter electrically coupled in a feedback loop to the match line. A match line is connected to a multiple of CAM cells in parallel comprising a stored word. The inverter includes an inverting threshold of the match line. The inverting threshold is equal to a first voltage threshold during a pre-charge phase. During an evaluation phase, the inverting threshold is equal to a second voltage threshold.

Another aspect of the invention is a method of sensing match lines in a CAM array. The method includes discharging a match line toward a ground voltage. A pre-charging step pre-charges the match line above a first voltage threshold during a pre-charge phase. Following the pre-charging phase, the match line is floated during an evaluation phase whence the stored word is compared with the input word to the CAM array. At a triggering step, a sense amplifier is triggered to output a digital signal if the match line voltage decays to a second voltage threshold. The pre-charging and triggering operations are controlled by an inverter with an inverting threshold voltage. The inverting threshold voltage is equal to the first threshold voltage during the pre-charge phase. The inverting threshold voltage is equal to the second threshold voltage during the evaluation phase.

DETAILED DESCRIPTION

The present invention is described with reference to embodiments of the invention, but shall not be limited to the referenced embodiments. Throughout the description of the present invention, references are made to FIGS. 1 through 4.

Embodiments of the present invention provide possible systems for a Content Addressable Memory (CAM) and possible methods for sensing match lines in such a system. An aspect of the present invention provides a dual threshold inverter for sensing the match line in a Content Addressable Memory (CAM). Such a mechanism is advantageous in providing improved sense margin between pre-charge and evaluation.

Figure 1:
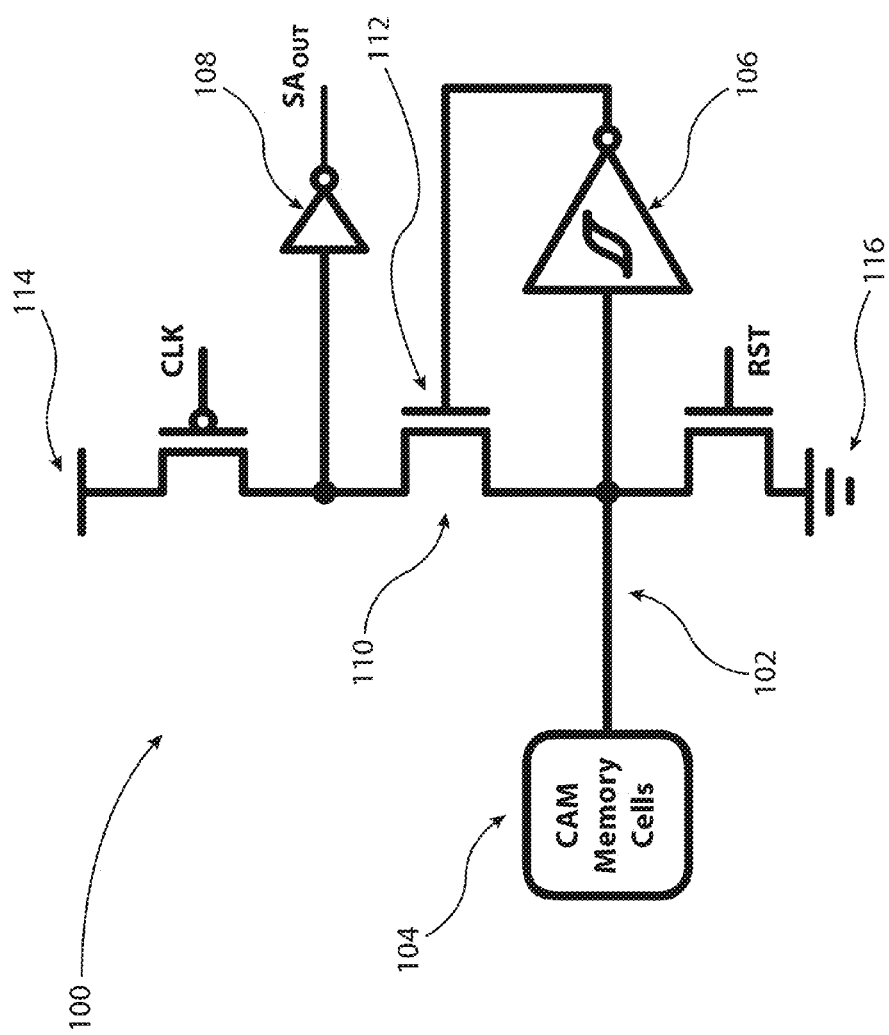
FIG. 1. is a diagram of an example sensing circuit in a CAM in accordance to one embodiment of the present invention.

FIG. 1. is a diagram of an example sensing circuit in a CAM 100 in accordance with one embodiment of the present invention. The sensing circuit includes a match line 102, wherein the match line 102 is electrically coupled to a plurality of CAM cells 104.

The sensing circuit 100 also includes an inverter 106, wherein the input of the inverter 106 is electrically coupled to the match line 102.

The sensing circuit 100 also includes a sense amplifier 108, wherein the sense amplifier 108 is configured to be electrically coupled to the match line 102 during the evaluation phase. The sense amplifier also includes an output (SA-out). The sense amplifier 108 is electrically coupled to the match line 102 through an access transistor 110.

The access transistor 110 includes a gate terminal 112, wherein the access transistor gate terminal 112 is electrically coupled to the output of the inverter 106.

The sensing circuit 100 also includes a power supply 114 coupled to the sense amplifier 108 input through a transistor controlled by a phase signal (CLK). A ground voltage 116 is coupled to the match line through a transistor controlled by a reset signal (RST).

Figure 2A:
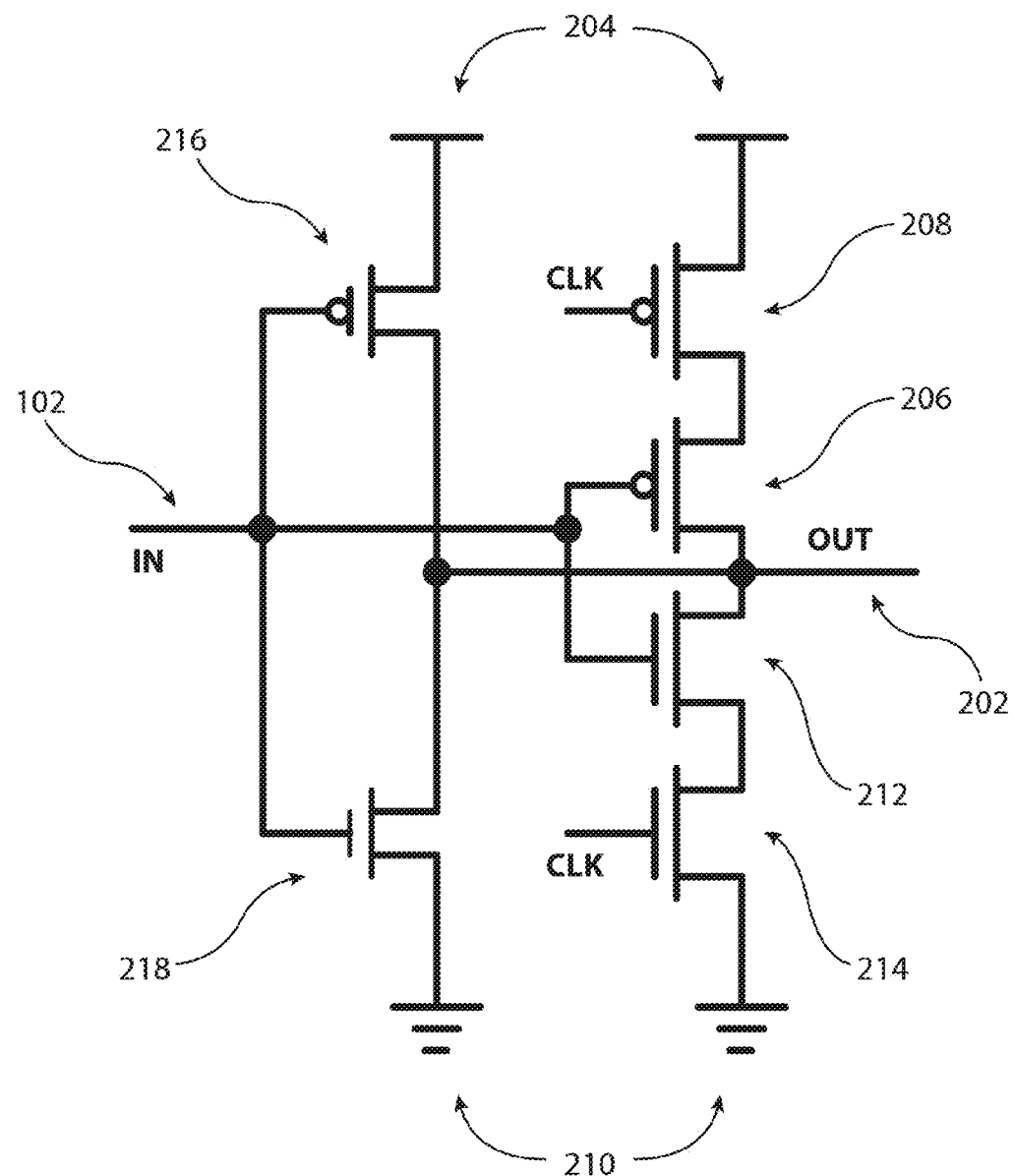
FIG. 2a is a diagram of an inverter in an example sensing circuit in accordance to one embodiment of the present invention.

FIG. 2a is a diagram of an example inverter 106 in the sensing circuit in accordance to one embodiment of the present invention. The inverter output 202 is electrically coupled to a supply voltage 204 through a first PMOS (P-type metal-oxide-semiconductor) transistor 206 and a second PMOS transistor 208 arranged in series circuit. The first PMOS transistor 206 is electrically coupled to the match line 102 at its gate terminal. The second PMOS transistor 208 is electrically coupled to the phase signal (CLK) at its gate terminal.

The inverter output 202 is also electrically coupled to a ground voltage 210 through a first NMOS (N-type metal-oxide-semiconductor) transistor 212 and a second NMOS transistor 214 arranged in series circuit. The first NMOS transistor 212 is electrically coupled to the match line 102 at its gate terminal. The second NMOS transistor 214 is electrically coupled to the phase signal (CLK) at its gate terminal.

The inverter output 202 is also electrically coupled to the supply voltage 204 through an inverting PMOS transistor 216. The inverting PMOS transistor 216 is electrically coupled to the match line 102 at its gate terminal.

The inverter output 202 is also electrically coupled to the ground voltage 210 through an inverting NMOS transistor 218. The inverting NMOS transistor 218 is electrically coupled to the match line 102 at its gate terminal.

In a particular embodiment, the first and second PMOS transistors 206 and 208 and first and second NMOS transistors 212 and 214 are greater in size than the PMOS and NMOS inverting transistors 216 and 218. The relative sizes of the PMOS and NMOS inverting transistors are discussed in more detail below.

Figure 2B:
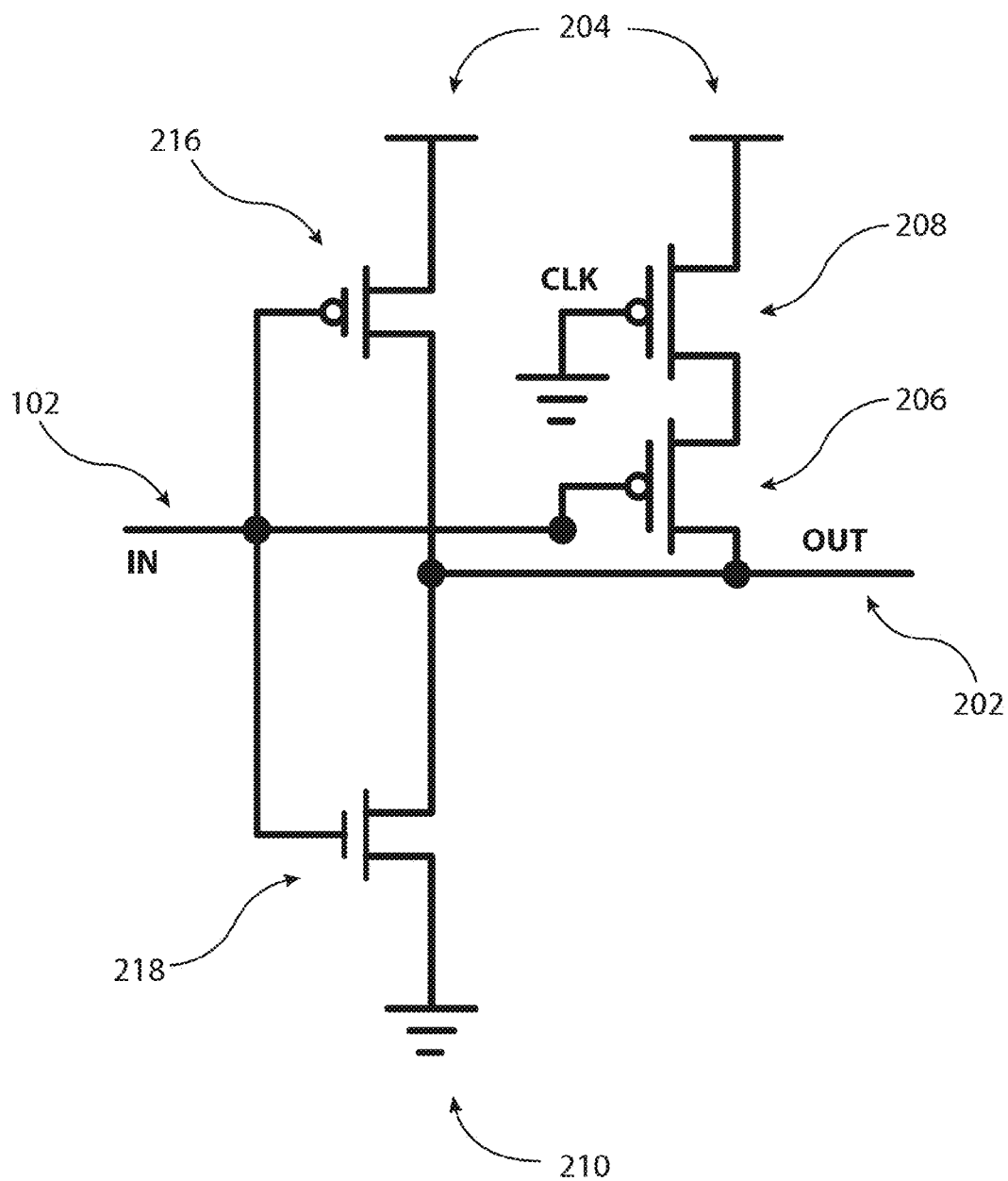
FIG. 2b is a diagram of the active elements in an example inverter during the pre-charge phase in accordance to one embodiment of the present invention.

FIG. 2b is an example diagram of the active elements in inverter 106 during the pre-charge phase, in accordance to one embodiment of the present invention. During the pre-charge phase the phase signal (CLK) is equal to substantially the ground voltage, turning on the second PMOS transistor 208. In one embodiment, the effective size ratio (beta) of the first and second PMOS transistors 208 and 206 plus the PMOS transistor 216 to the NMOS transistor 218 is a value of 2.0.

Figure 2C:
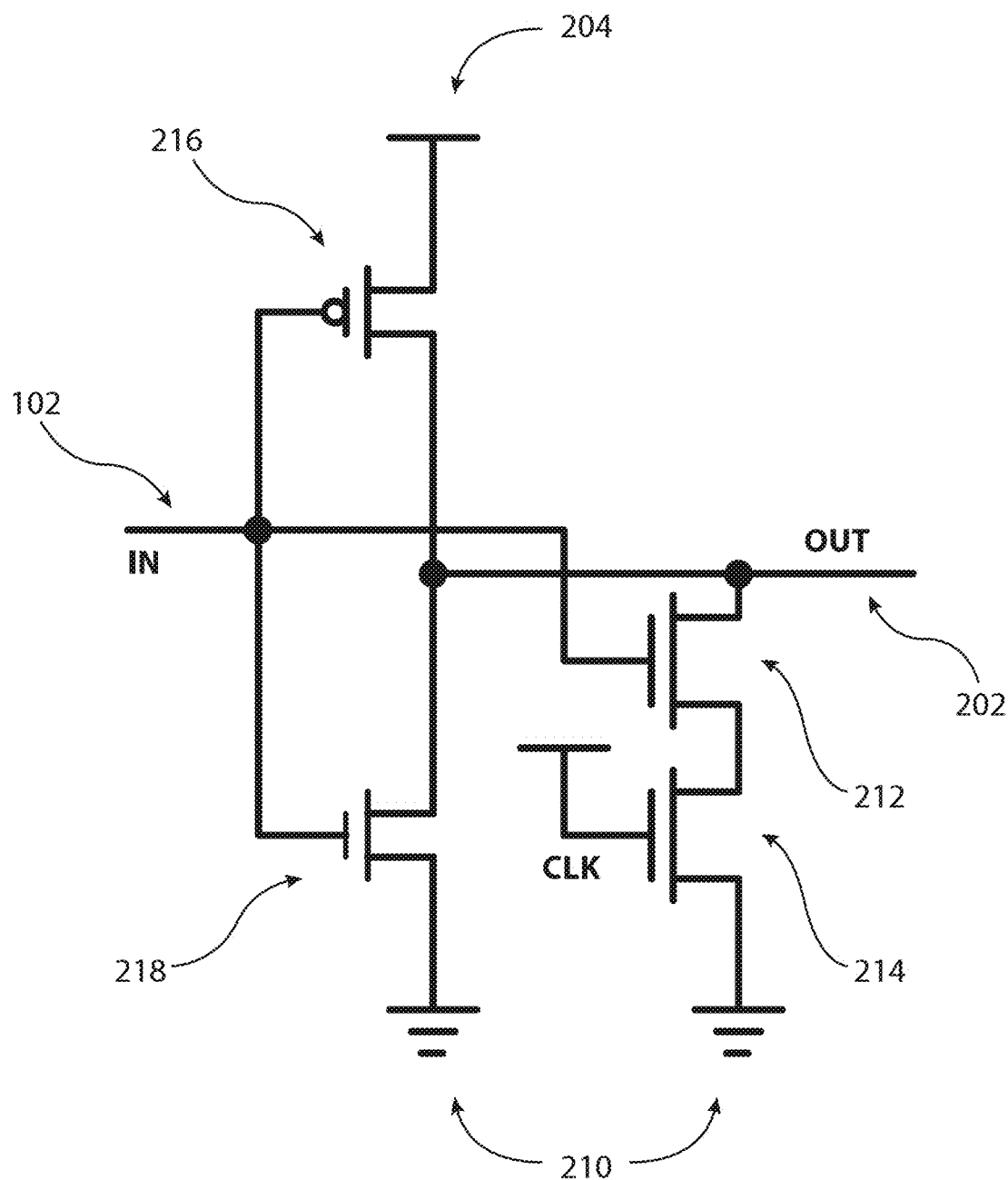
FIG. 2c is a diagram of the active elements in an example inverter during the evaluation phase, in accordance to one embodiment of the present invention.

FIG. 2c is an example diagram of the active elements in inverter 106 during the evaluation phase, in accordance to one embodiment of the present invention. During the evaluation phase the phase signal (CLK) is equal to substantially the supply voltage, turning on the second NMOS transistor 214. In one embodiment, the effective size ratio (beta) of the first and second NMOS transistors 212 and 214 plus the NMOS transistor 218 to the PMOS transistors 216 is a value of one 0.5.

Figure 3:
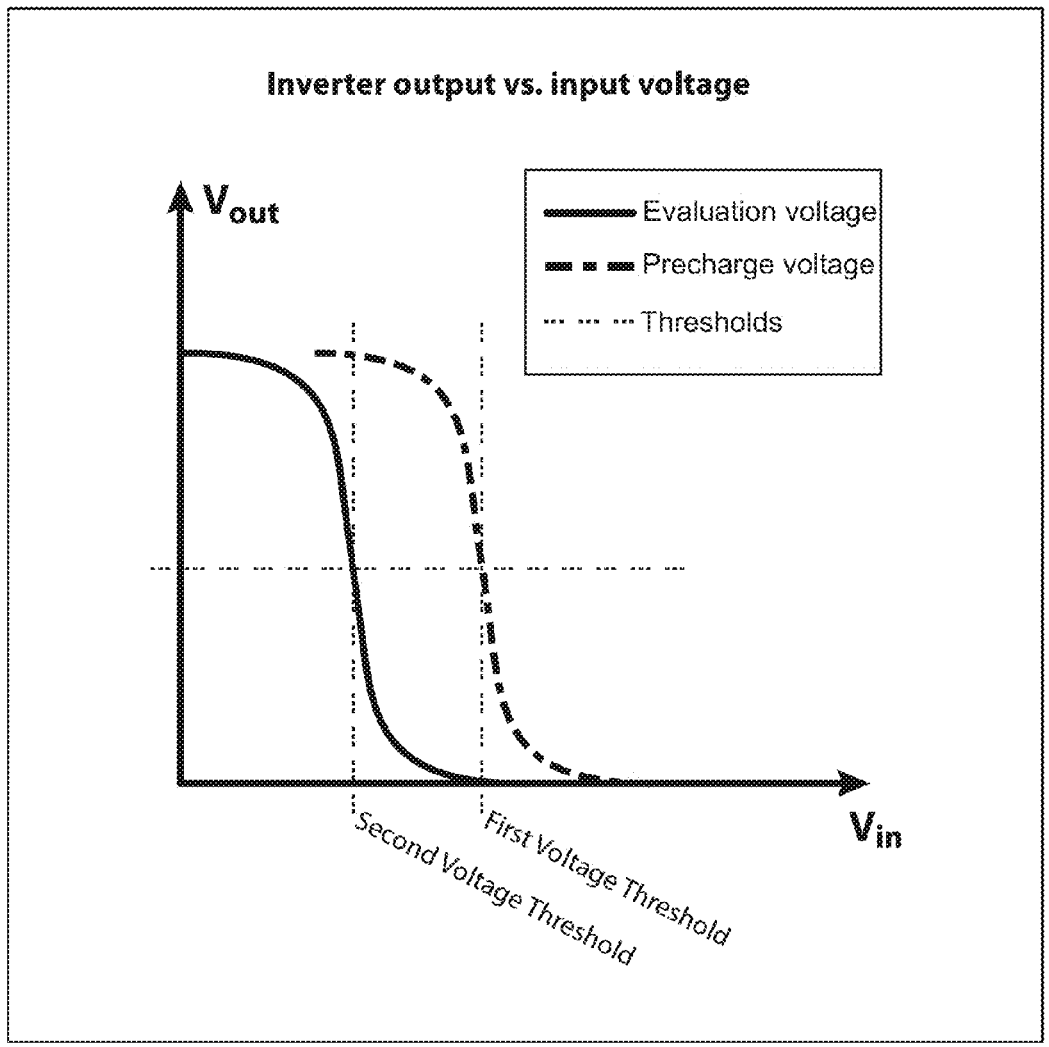
FIG. 3 is a graph displaying the correlation of voltage output versus voltage input in an example inverter.

FIG. 3 is a graph displaying the correlation of voltage output versus voltage input for an example inverter. The inverter includes an inverting threshold voltage for the match line coupled to the input voltage of the inverter (V-in).

During the pre-charge phase the inverting threshold is equal to a first voltage threshold, wherein the match line is charged to substantially above the first voltage threshold.

During the evaluation phase, the inverting threshold is equal to a second voltage threshold. The evaluation phase begins when the match line voltage drops from substantially the first voltage threshold to substantially the second voltage threshold. The first voltage threshold is greater than the second voltage threshold.

Figure 4:
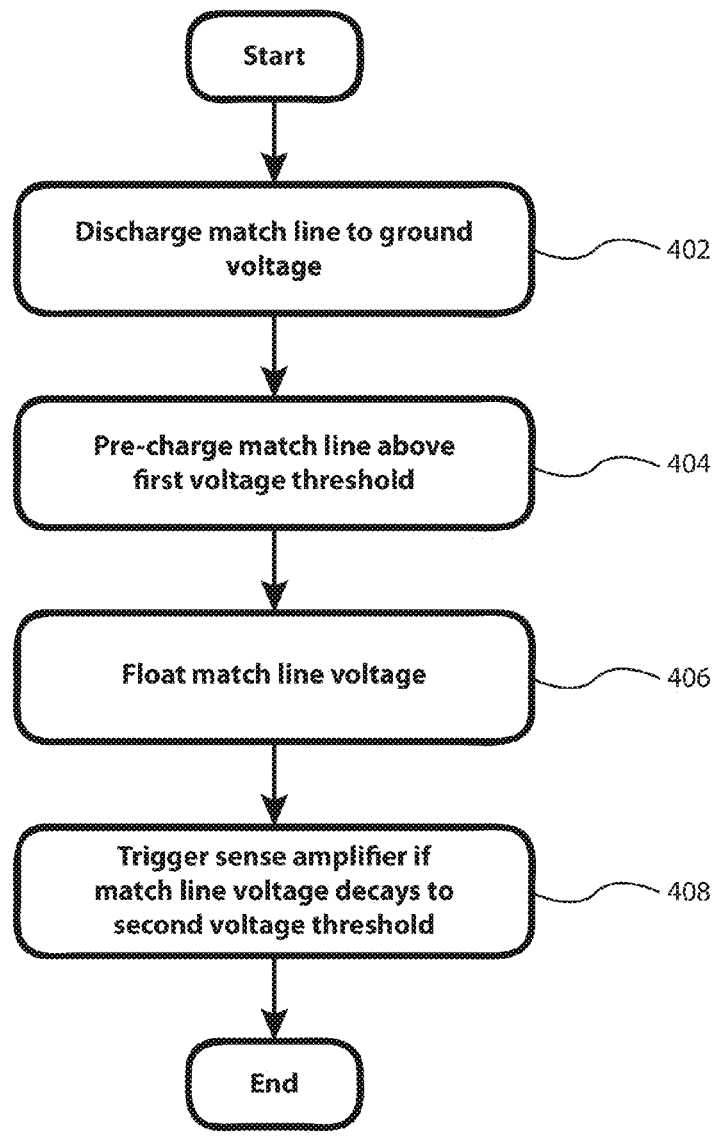
FIG. 4 is a flow chart displaying a method of sensing match lines in a CAM in accordance to one embodiment of the present invention.

FIG. 4 is a flow chart representing a method of sensing match lines in a CAM in accordance to one embodiment of the present invention.

The method begins with discharging step 402. In discharging step 402, the match line 102 is electrically coupled to a ground voltage 116. After discharging step 402 is completed, the method continues to the pre-charging step 404.

In pre-charging step 404, the match line 102 is charged substantially above the first voltage threshold. During the pre-charging step 404, the match line 102 is electrically coupled to the supply voltage 114 through the access transistor 110. The access transistor 110 is controlled by the inverter 106. Additionally, the input of the sense amplifier 108 is electrically coupled to the supply voltage 114. In some embodiments, the coupling of the sense amplifier 108 to the supply voltage 114 is controlled by a phase signal. After pre-charging step 404 is completed, the method continues to floating step 406.

In floating step 406, the match line voltage decays from the first voltage threshold. After floating step 406 is completed, the method continues to triggering step 408.

In triggering step 408, the sense amplifier 108 outputs a digital signal if the match line voltage decays from substantially above the first voltage threshold to substantially the second voltage threshold. During triggering step 408, the input of the sense amplifier 108 is electrically coupled to the match line 102 through the access transistor 110. The access transistor 110 is controlled by the inverter 106. The inverter 106 triggers the access transistor 110 when the match line voltage drops to substantially the second voltage threshold. After triggering step 408 is completed, the method ends.

Having described preferred embodiments for a sensing circuit for CAM and the method for sensing the match lines in such a CAM, (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A sensing circuit in a Content Addressable Memory (CAM), the sensing circuit comprising:
   a match line electrically coupled to a plurality of CAM cells; and
   an inverter electrically coupled in a feedback loop to the match line, the inverter including an inverting threshold of the match line, the inverting threshold equal to a first voltage threshold during a pre-charge phase, the inverting threshold equal to a second voltage threshold during an evaluation phase;
   wherein the inverter receives a phase signal indicating whether the sensing circuit is in the pre-charge phase or the evaluation phase;
   wherein the output of the inverter is electrically coupled to a supply voltage through a first PMOS (P-type metal-oxide-semiconductor) transistor and a second PMOS transistor arranged in series circuit, wherein the first PMOS transistor is electrically coupled to the match line at its gate terminal, and the second PMOS transistor is electrically coupled to the phase signal at its gate terminal; and
   wherein the output of the inverter is electrically coupled to a ground voltage through a first NMOS (N-type metal-oxide-semiconductor) transistor and a second NMOS transistor arranged in series circuit, wherein the first transistor is electrically coupled to the match line at its gate terminal, and the second NMOS transistor is electrically coupled to the phase signal at its gate terminal.

2. The sensing circuit of claim 1, further comprising:
   wherein during the pre-charge phase the match line is charged to substantially the first voltage threshold; and
   wherein during the evaluation phase, the sensing circuit determines if the match line reaches substantially the second voltage threshold within a predetermined period of time.

3. The sensing circuit of claim 1, wherein the first voltage threshold is greater than the second voltage threshold.

4. The sensing circuit of claim 1, further comprising a sense amplifier configured to be electrically coupled to the match line during the evaluation phase when a match line voltage drops from substantially the first voltage threshold to substantially the second voltage threshold.

5. The sensing circuit of claim 4, further comprising:
wherein the match line is electrically coupled to an input of the inverter; and
wherein the sense amplifier is electrically coupled to the match line through an access transistor, the access transistor electrically coupled to an output of the inverter.

6. The sensing circuit of claim 1, further comprising:
wherein the output of the inverter is electrically coupled to the supply voltage through an inverting PMOS transistor, wherein the inverting PMOS transistor is electrically coupled to the match line at its gate terminal; and
wherein the output of the inverter is electrically coupled to the ground voltage through an inverting NMOS transistor, wherein the inverting NMOS transistor is electrically coupled to the match line at its gate terminal.

7. The sensing circuit of claim 6, wherein the first and second PMOS transistors and the first and second NMOS transistors are greater in size than the PMOS and NMOS inverting transistors.

8. A Content Addressable Memory (CAM) comprising:
a match line;
a plurality of CAM cells electrically coupled in parallel circuit to the match line; and
an inverter electrically coupled in a feedback loop to the match line, the inverter including an inverting threshold of the match line, the inverting threshold equal to a first voltage threshold during the pre-charge phase, the inverting threshold equal to a second voltage threshold during an evaluation phase;
wherein the inverter receives a phase signal indicating whether a sensing circuit is in the pre-charge phase or the evaluation phase;
wherein the output of the inverter is electrically coupled to a supply voltage through a first PMOS (P-type metal-oxide-semiconductor) transistor and a second PMOS transistor arranged in series circuit, wherein the first PMOS transistor is electrically coupled to the match line at its gate terminal, and the second PMOS transistor is electrically coupled to the phase signal at its gate terminal; and
wherein the output of the inverter is electrically coupled to a ground voltage through a first NMOS (N-type metal-oxide-semiconductor) transistor and a second NMOS transistor arranged in series circuit, wherein the first transistor is electrically coupled to the match line at its gate terminal, and the second NMOS transistor is electrically coupled to the phase signal at its gate terminal.

9. The CAM of claim 8, further comprising:
wherein during the pre-charge phase the match line is charged to substantially the first voltage threshold; and
wherein during the evaluation phase, the sensing circuit determines if the match line reaches substantially the second voltage threshold within a predetermined period of time.

10. The CAM of claim 8, further comprising a clock signal configured to select between the pre-charge phase and the evaluation phase.

11. The CAM of claim 8, wherein the first voltage threshold is greater than the second voltage threshold.

12. The CAM of claim 8, a sense amplifier configured to electrically couple to the match line during the evaluation phase when a match line voltage drops from substantially the first voltage threshold to substantially the second voltage threshold.

13. The CAM of claim 12, further comprising:
wherein the match line is electrically coupled to an input of the inverter; and
wherein the sense amplifier is electrically coupled to the match line through an access transistor, the access transistor electrically coupled to an output of the inverter.

14. A method of sensing match lines in a Content Addressable Memory (CAM), the method comprising:
discharging a match line toward a ground voltage;
pre-charging the match line to a first voltage threshold during a pre-charge phase after discharging the match line;
floating the match line during an evaluation phase after the pre-charging phase;
triggering a sense amplifier to output a digital signal if the match line voltage decays to a second voltage threshold; and
wherein the pre-charging and triggering are controlled by an inverter, the inverter having an inverting threshold voltage equal to the first threshold voltage during the pre-charge phase, the inverter having the inverting threshold voltage equal to the second threshold voltage during the evaluation phase;
receiving by the inverter a phase signal indicating whether a sensing circuit is in the pre-charge phase or the evaluation phase;
wherein the output of the inverter is electrically coupled to a supply voltage through a first PMOS (P-type metal-oxide-semiconductor) transistor and a second PMOS transistor arranged in series circuit, wherein the first PMOS transistor is electrically coupled to the match line at its gate terminal, and the second PMOS transistor is electrically coupled to the phase signal at its gate terminal; and
wherein the output of the inverter is electrically coupled to a ground voltage through a first NMOS (N-type metal-oxide-semiconductor) transistor and a second NMOS transistor arranged in series circuit, wherein the first transistor is electrically coupled to the match line at its gate terminal, and the second NMOS transistor is electrically coupled to the phase signal at its gate terminal.

15. The method of claim 14, further comprising determining an output state of the sense amplifier at a predetermined time after initiation of the evaluation phase.

16. The method of claim 14, further comprising coupling the input of the sense amplifier to a supply voltage during the pre-charge phase.

17. The method of claim 14, further comprising electrically coupling the match line toward a ground voltage immediately before the pre-charge phase.

18. The method of claim 14, further comprising electrically coupling an input of a sense amplifier to the match line.

19. The method of claim 14, wherein the first voltage threshold is greater than the second voltage threshold.

* * * * *